United States Patent [19]

Mazin et al.

[11] Patent Number: 4,472,821
[45] Date of Patent: Sep. 18, 1984

[54] DYNAMIC SHIFT REGISTER UTILIZING CMOS DUAL GATE TRANSISTORS

[75] Inventors: Moshe Mazin; William E. Engeler, both of Scotia, N.Y.

[73] Assignee: General Electric Company, Schenectady, N.Y.

[21] Appl. No.: 374,587

[22] Filed: May 3, 1982

[51] Int. Cl.³ ............... G11C 19/28; H03K 17/04; H03K 17/687; H03K 19/017
[52] U.S. Cl. .................................. 377/79; 307/443; 307/451; 357/23 MG; 357/86; 357/23.14; 377/80
[58] Field of Search ............... 307/443, 451, 303–304, 307/576, 579, 585; 357/23 MG, 42, 86; 377/74, 79, 80

[56] References Cited

U.S. PATENT DOCUMENTS

| | | | |
|---|---|---|---|
| 3,715,637 | 2/1973 | Poirier | 307/451 |
| 4,101,790 | 7/1978 | Ebihara et al. | 377/79 |
| 4,306,352 | 12/1981 | Schrader | 357/23 MG X |
| 4,319,263 | 3/1982 | Rao | 357/23 S X |
| 4,395,774 | 7/1983 | Rapp | 307/576 X |

OTHER PUBLICATIONS

W. P. Noble, Jr.; "Short-Channel Effects in Dual-Gate Field-Effect Transistors," in IEEE Int. Electron Dev. Mtg., Dig. Tech. Papers, Dec. 1978, pp. 483–486.
Hans G. Dill, "A New Insulated Gate Tetrode With High Drain Breakdown Potential and Low Miller Feedback Capacitance," *IEEE Transactions on Electron Devices*, Vol. ED-15, No. 10, Oct. 1968.

*Primary Examiner*—Stanley D. Miller
*Assistant Examiner*—David R. Hudspeth
*Attorney, Agent, or Firm*—Julius J. Zaskalicky; James C. Davis, Jr.; Marvin Snyder

[57] ABSTRACT

A shift register using dual gate transistors is described. Each stage consists of a P-channel and and N-channel dual gate transistor interconnected to provide both an inverting function and a switching function. The gates of each stage of one set of alternate stages are clocked in one phase with a clocking voltage alternating between a low level and a high level and its inverse. The gates of each stage of the other set of alternative stages are clocked in the opposite phase with the clocking voltage and its inverse.

1 Claim, 4 Drawing Figures

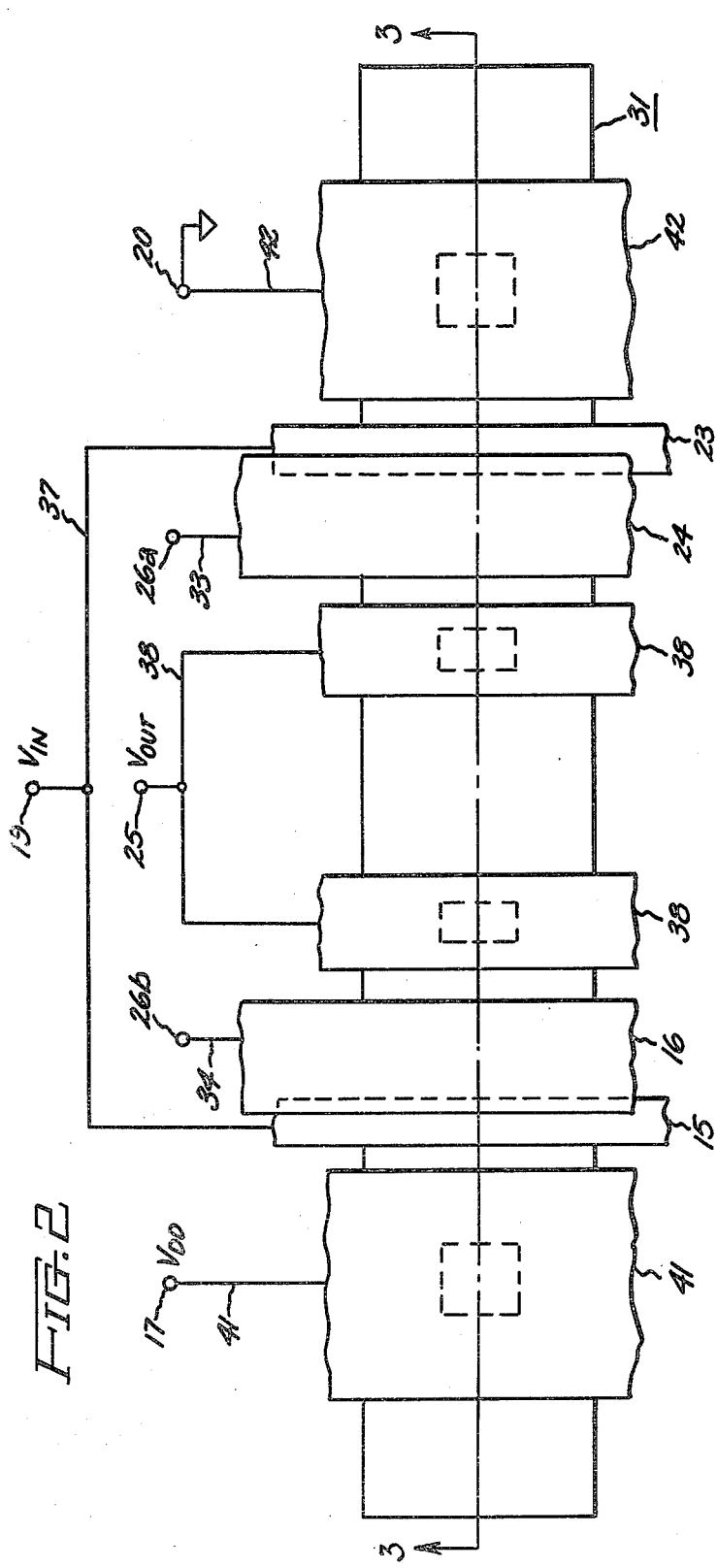
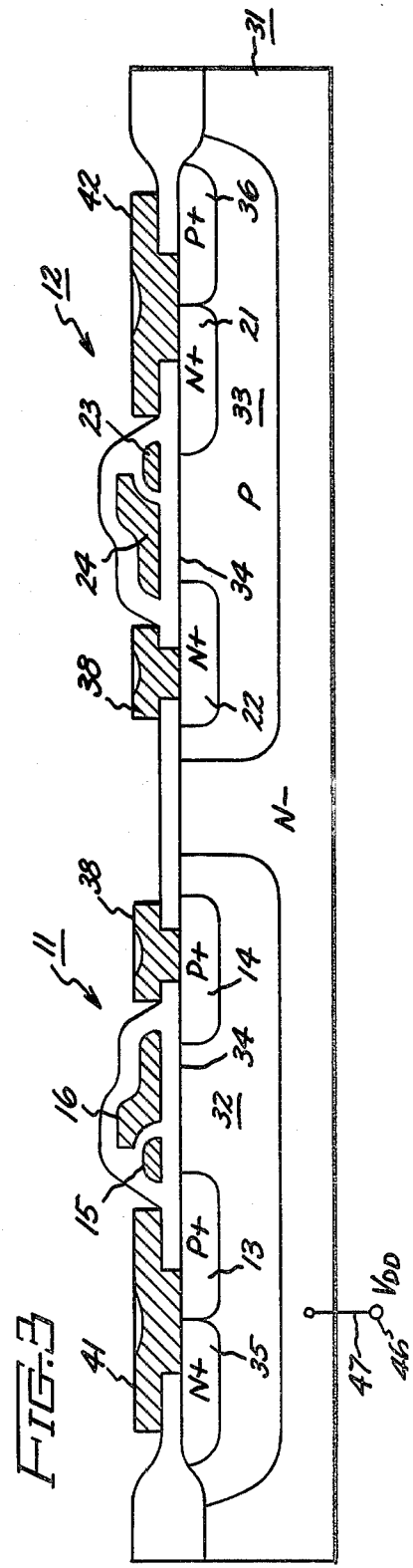
FIG. 2
FIG. 3

DYNAMIC SHIFT REGISTER UTILIZING CMOS DUAL GATE TRANSISTORS

The present invention relates to a dynamic shift register utilizing CMOS inverters constituted of dual gate MOSFET transistors.

Dynamic shift registers utilizing CMOS inverters constituted of single gate MOSFET transistors are known in the art. Each stage of the shift register includes a CMOS inverter and a bidirectional switch. The CMOS inverter comprises a P-channel and an N-channel transistor in which the source-to-drain conduction paths are connected in series between a pair of reference potentials. The gates of the devices are connected together and to an input terminal. The drains of the transistors are connected together and to an output terminal. In response to a low absolute level of signal at the input terminal a high absolute level of signal is produced at the output terminal and conversely in response to a high absolute level at the input terminal a low absolute level of signal is produced at the output terminal. The bidirectional switch comprises a P-channel transistor and an N-channel transistor, the source-to-drain conduction path of each of which is connected between the input terminal of a stage and the input terminal of the inverter. The output terminal of a stage is connected to the output terminal of the inverter. A clocking voltage is applied to the gate of one transistor and an inverse clocking voltage is applied to the gate of the other transistor of the switch to turn the switch on and off at the clocking frequency. The bidirectional switches in a first set of alternate stages of the shift register are identically actuated by the application of identical clocking and inverse clock voltages to each of the gates thereof to simultaneously turn each switch on and off. The bidirectional switches of the other set of alternate stages are also identically actuated by identical application of clocking and inverse clock voltages to each of the stages thereof to simultaneously turn each switch on and off. However, the "on" phase of the bidirectional switches of the second set of alternate stages corresponds to the "off" phase of the bidirectional switches of the first set of alternate stages. Thus, a bit stored at the output node or terminal of one stage of a set is shifted to the output node or terminal of the succeeding stage of the set during each clock cycle.

A particular advantage of the CMOS shift register described above is low power consumption. Among the disadvantages are limited speed of response due to the capacitance of the input and output nodes or terminals of each of the stages. The input node is constituted of the capacitance of the gate electrodes of the inverter of a stage and the capacitance of the bidirectional switch connected thereto. The output node of the transistor is constituted of the capacitance of the drains of the transistors with respect to the substrate. In addition, the gate electrodes of the inverter overlap the drain regions thereof constituting the output node and produce an additional capacitive effect which is enhanced by the action of the output node in a manner analogous to Miller effect capacitance of linear circuits.

The present invention is directed to eliminating limitations such as described above in dynamic shift registers utilizing CMOS stages of conventional constitution and organization.

An object of the present invention is to provide a CMOS shift register of high speed.

Another object of the present invention is to provide a CMOS shift register simpler in organization than conventional CMOS shift registers.

A further object of the present invention is to provide a CMOS shift register each stage of which utilizes fewer transistors and occupies less semiconductor surface area than conventional CMOS shift registers.

In accordance with an illustrative embodiment of the present invention, there is provided the plurality of stages, each stage having an input terminal and an output terminal. The output terminal of a stage is connected to the input terminal of succeeding stage. The input terminal of the first stage constitutes the input terminal of the shift register and the output of the last stage constitutes the output terminal of the shift register.

Each stage includes a first P-channel transistor having a first source, a first drain, a first source-adjacent gate, a first drain-adjacent gate, and a second N-channel transistor having a second source, a second drain, a second source-adjacent gate and a second drain-adjacent gate. Means are provided for connecting the first source-adjacent gate electrode and the second source-adjacent gate of each of the stages to a respective input terminal. Means are provided for connecting the first drain and the second drain of each of the stages to a respective output terminal. Means are provided for connecting the first source of each of the stages to a first supply terminal to which a first reference is applied. Means are provided for connecting the second source of each of said stages to a second supply terminal to which a second reference potential is applied. The first reference potential is positive with respect to the second reference potential. A first clocking voltage having alternating periods of high level and low level is provided. A second clocking voltage which is the inverse of the first clocking voltage is also provided. The first clocking voltage is applied to the second drain-adjacent gate and the second clocking voltage is applied to the first drain-adjacent gate of each of the stages of one set of alternate stages of the shift register. The first clocking voltage is also applied to the first drain-adjacent gate and the first clocking voltage is also applied to the second drain-adjacent gate of each of the stages of the other set of alternate stages of the shift register. The low level of the clocking voltages is sufficiently negative with respect to the first reference potential to render the portion of channel region underlying the first drain-adjacent gate of each of the stages conductive and the portion of the channel region underlying the second drain-adjacent gate of each of the stages nonconductive. The high level of the clocking voltages is sufficiently positive with respect to the second reference potential to render the portion of channel region underlying the first drain-adjacent gate of each of the stages nonconductive and the portion of the channel region underlying the second drain-adjacent gate of each of the stages conductive.

The features which are belived to be characteristic of the present invention are set forth with particularity in the appended claims. The invention itself, both as to its organization and method of operation, together with further objects and advantages thereof, may best be understood by reference to the following description taken in connection with the accompanying drawings in which:

FIG. 2 is a plan view of one implementation of the circuit of FIG. 1.

FIG. 3 is a sectional view of the circuit of FIG. 2.

Figure 1:
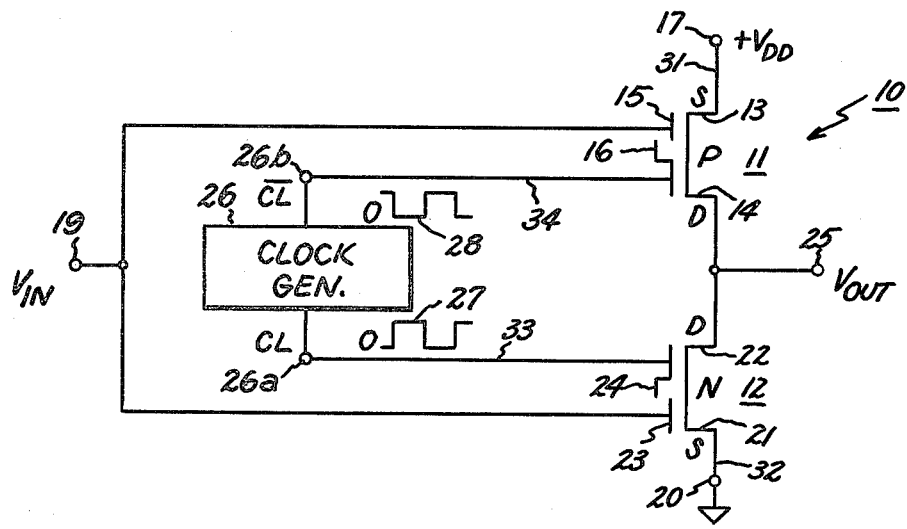
FIG. 1 is a schematic diagram of a stage of the shift register of the present invention.

Reference is now made to FIG. 1 which shows a schematic diagram of a stage 10 of the dynamic shift register in accordance with the present invention. The circuit includes a first P-channel transistor 11 and a second N-channel transistor 12. Each of the transistors are dual gate transistors of the kind described and claimed in U.S. patent application Ser. No. (RD-14175), assigned to the assignee of the present invention and incorporated herein by reference thereto. The first transistor 11 includes a first source 13, a first drain 14, a first source-adjacent gate 15 and a first drain-adjacent gate 16. The second transistor 12 includes a second source 21, a second drain 22, a second source-adjacent gate 23 and a second drain-adjacent gate 24. The source 13 is connected over conductive line 31 to a first supply terminal 17 to which a first reference potential $V_{DD}$ is connected. The drain 14 of the first transistor 11 and the drain 22 of the second transistor 12 are connected to output terminal 25. The source 21 of the second transistor is connected over conductive line 32 to a second supply terminal 20 which is connected to ground and referred to as a second reference potential. The potential $V_{DD}$ applied to terminal 17 is positive with respect to potential of terminal 20. The gate electrodes 15 and 23 are each connected to an input terminal 19. A clock generator 26 is provided having an output terminal 26a at which clocking voltage 27 is supplied and an output terminal 26b at which an inverse clocking voltage 28 is supplied. Both clocking voltage 27 and 28 swing between a low and a high level. When clocking voltage 27 is at a high level inverse clocking voltage 28 is at a low level and vice versa. The gate electrode 24 is connected over conductive line 33 to terminal 26a of clock generator 26. The gate electrode 16 is connected over conductive line 34 to terminal 26a of clock generator 26.

Consider now the operation of the circuit of FIG. 1. When clock voltage at terminal 26a is at its high level, the portion of the channel region of transistor 12 underlying drain-adjacent gate electrode 24 will invert and become conductive. The inverse clock voltage at terminal 26b, will be at low level during this period of time. Accordingly, the channel region of the first transistor 11 underlying drain-adjacent gate electrode 16 will also become conductive. If a logic zero or low level signal is applied to input terminal 19, the remaining portion of the channel region of the first transistor 11 will become conductive and the remaining portion of the channel region of the second transistor will become non-conductive. Accordingly, the potential at output terminal 25 rises toward potential $V_{DD}$ providing a high level or logic one signal at the output terminal 25. If a logic one or high level signal is applied to input terminal 19, the portion of the channel region of the second transistor 12 underlying source-adjacent gate electrode 23 will become conductive and the first portion of the channel region of the first transistor 11 underlying source-adjacent gate electrode 15 will become nonconductive. Thus, the potential of output terminal 25 will fall toward ground potential or low level. Accordingly, for a logic one applied at input terminal 19, a logic zero would appear at output terminal 25. When the clock voltage appearing at output terminal 26a is at its low level and inverse clock potential is high level, the portion of the channel region of the first transistor 11 underlying the drain-adjacent gate electrode 16 is not inverted and also the portion of the channel region of the second transistor underlying the drain-adjacent gate electrode 24 is not inverted. Thus, both the first transistor 11 and the second transistor 12 are rendered nonconductive. Accordingly, the output terminal 25 is disconnected from both potential $V_{DD}$ and ground. Thus, three states are possible at the output terminal 25. A zero or low-level state, a one or high level state or a disconnected state. The circuit of FIG. 1 provides both an inverting function and a switching function.

Reference is now made to FIGS. 2 and 3 which show a plan and a sectional view, respectively, of one implementation of the circuit of FIG. 1 in integrated circuit form. The elements of FIGS. 2 and 3 identical to the elements of FIG. 1 are identically designated. The first transistor 11 and the second transistor 12 are formed on a common substrate 31 of silicon semiconductor material of N-type conductivity. The first transistor is formed in a first well region 32 of N-type conductivity of the substrate 31. The first transistor 11 includes a first region or source 13 of P-type conductivity adjacent a major surface 34 of the first well region 32. The first region 13 of P-type conductivity is conductively connected to first well region 32 by means of a region of N-type conductivity 35. The first transistor 11 also includes a second region or drain 14 of P-type conductivity in the first well region also adjacent the major surface 34 and spaced from the first region of P-type conductivity to define a first channel region therebetween. Source-adjacent gate electrode 15 is insulatingly spaced over a first portion of the first channel region and over a portion of the first region 13 of P-type conductivity. Drain-adjacent gate electrode 16 insulatingly overlies a second portion of the first channel region contiguous to the second region 14 of P-type conductivity. The first portion and the second portion of the first channel region are contiguous. The second transistor 12 is formed in a second well region 33 of P-type conductivity of the substrate 31. The second transistor 12 includes a first region or source 21 of N-type conductivity in the second well region 33 adjacent the major surface 34 thereof. The first region 21 of N-type conductivity is conductively connected to the second well region 33 by means of a region of P-type conductivity 36. The second transistor 12 includes a second or drain region 22 of N-type conductivity in the second well region 33 adjacent the major surface 34 and spaced from the first region 21 of N-type conductivity to define a second channel region therebetween. Source-adjacent gate electrode 23 insulatingly overlies a first portion of the second channel region and a portion of the first region 21 of N-type conductivity. Drain-adjacent gate electrode 24 insulatingly overlies a second portion of the second channel region contiguous to the second region 22 of N-type conductivity. The first portion and the second portion of the second channel region are contiguous. The gate electrode 15 of the first transistor 11 and the gate electrode 23 of the second transistor 12 are connected over a conductive line 37 to input terminal 19. The second region 14 of P-type conductivity of the first transistor 11 and the second region 22 of N-type conductivity of the second transistor 12 are connected over conductive line 38 to output terminal 25. The first region 13 of P-type conductivity of the first transistor 11 is connected over a conductive line 41 to terminal 17. The first region 21 of N-type conductivity of the second transistor 12 is connected over conductor 42 to terminal 20 and ground. The gate electrode 16 of the first transistor 11 is connected over conductive line 44 to terminal 26b. The gate electrode 24 of the second transistor 12 is connnected over conductive line 43 to terminal 26a. Substrate 31 is connected over conductive line 47 to terminal 46 to which is supplied potential $V_{DD}$. In the circuit of FIGS. 2 and 3, the capacitance between gate electrodes 15 and 16 of P-channel transistor 11 is preferably equal to or balanced with the capacitance between gate electrodes 23 and 24 of N-channel transistors to maintain clock driving power at a minimum. The balance or equality of these capacitances may be obtained by adjusting the width of these gate electrodes.

Figure 4:
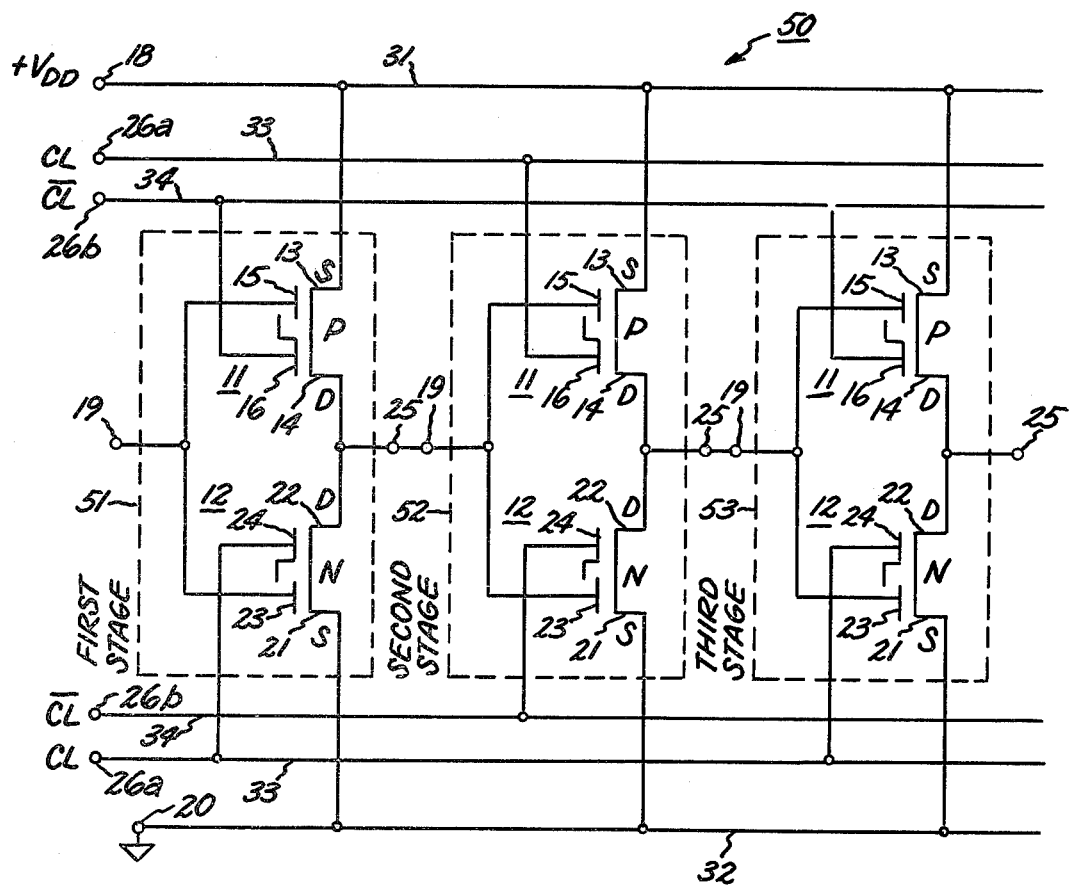
FIG. 4 is a schematic diagram of the shift register of the present invention.

Reference is now made to FIG. 4 which shows a schematic diagram of a shift register 50 in accordance with the present invention. The shift register 50 includes a plurality of stages only the first stage 51, the second stage 52 and a third stage 53 of which are shown. Each of the stages 51-53 is identical to the single stage 10 shown and described in connection with FIG. 1. Each stage of the shift register includes a first P-channel transistor 11 having a first source 13, a first drain 14, a first source-adjacent gate 15 and a first drain-adjacent gate 16 and also includes a second N-channel transistor 12 having a second source 21, a second drain 22, a second source-adjacent gate 23 and a second drain adjacent gate 24. The first source-adjacent gate 15 and the second source-adjacent gate 23 of each of the stages is connected to a respective input terminal 19. The first drain 14 and the second drain 22 of each of the stages is connected to a respective output terminal 25. The first sources 13 of each of the stages is connected over a conductive line 31 to supply terminal 17 to which a first reference voltage $V_{DD}$ is applied. The second sources 21 of each of the stages is connected over line 32 to a second supply terminal 20 connected to ground referred to as a second reference potential. The first reference potential $V_{DD}$ is positive with respect to the second reference potential or ground. The second drain-adjacent gates 24 of each of the odd numbered stages is connected over conductive line 33 to terminal 26a to which a first clocking voltage having an alternate periods of high level and low level is applied. The first drain-adjacent gates 16 of the odd numbered stages are connected over line 34 to terminal 26b to which the second clock voltage is applied which is the inverse of the first clocking voltage. The first drain-adjacent gates 16 of the even number stages are connected over line 33 to terminal 26a to which the first clocking voltage is applied. The second drain adjacent gates 24 of each of the even stages of the shift register is connected over line 34 to terminal 26b to which the second or inverse clocking voltage is applied. The input terminal of the first stage constitutes the input terminal of the shift register. The output terminal of the last stage of the shift register constitutes the output terminal of the shift register. The output terminal of each stage of the shift register except the last is connected to the input terminal of the succeeding stage.

Now consider the operation of the shift register of FIG. 4. During a first period of time the first clocking voltage is at its high level and the second or inverse clocking voltage is at its low level. Thus, the portion of the channel region underlying the drain-adjacent gates 16 of the first or P-channel transistors 11 of the odd numbered stages is inverted and hence conductive. Also, the portion of the channel region underlying the drain-adjacent gates 24 of the second or N-channel transistors 12 of the odd numbered stages is conductive. Accordingly, a low level signal applied at the input terminal 19 thereof appears as a high level signal at the output terminal 25 thereof and conversely a high level signal appearing at the input terminal 19 appears as a low level signal at the output terminal as described in connection with the circuit of FIG. 1. During the first period of time, as a high level voltage is applied to the first drain-adjacent gates 16 of the even numbered stages, the portion of the channel region underlying the first drain-adjacent gates 16 of the first transistors 11 of the even numbered stages is nonconductive. Also, as a low level voltage is applied to the second drain-adjacent gates 24 of the even numbered stages, the portion of the channel region underlying the second drain adjacent gates 20 of the second transistors of the even numbered stages is nonconductive. Thus, the input of each of the even numbered stages is disconnected from the output thereof isolating successive odd numbered stages. During a second period of time, when the first clocking voltage is at its low level and the second clocking voltage is at its high level, the even numbered stages of the shift register are rendered operative to invert signals applied to its input terminal. Conversely, the odd numbered stages are rendered inoperative thereby isolating successive even numbered stages of a shift register. Thus, over a clocking cycle a level or bit at the input of one stage is advanced two stages in the shift register.

While the invention has been described in an integrated circuit implementation in FIGS. 2 and 3 in which a two tub or well process sequence has been employed with the N-type and P-type wells being formed in a relatively low conductivity N-type substrate, alternative CMOS fabrication procedures well known to those skilled in the art may be utilized, such as a P-well process in which P-wells are formed in relatively higher conductivity N-type substrates.

While the P-type and N-type conductivity well regions in FIGS. 2 and 3 are shown as formed in a substrate of a suitable semiconductor material, such as silicon, the P-type well and N-type well regions could be islands of silicon on a suitable substrae such as sapphire. In such configurations well region contacts would be replaced by eqiivalent island contacts and substrate contacts would be eliminated.

While the invention has been described in a specific embodiment, it will be understood that modifications may be made by those skilled in the art, and it is intended by the appended claims to cover all such modifications and changes as fall within the true spirit and scope of the invention.

What is claimed is:

1. A shift register comprising:
a plurality of stages, each stage having an input terminal and an output terminal, the output terminal of a stage connected to the input terminal of a succeeding stage, first and second supply terminals, the input terminal of the first of said stages constituting the input terminal of said shift register and the output terminal of the last of said stages constituting the output terminal of said shift register, each stage including a first P-channel transistor having a first source, a first drain, a first source-adjacent gate, and a first drain-adjacent gate, and a second N-channel transistor having a second source, a second drain, a second source-adjacent gate, and a second drain-adjacent gate, means for connecting said first source-adjacent gate and said second source-adjacent gate of each of said stages to a respective input terminal, means for connecting said first drain and said second drain of each of said stages to a respective output terminal, means for connecting the first source of each of said stages to a first supply terminal to which a first reference potential is applied, means for connecting the second source of each of said stages to a second supply terminal to which a second reference potential is applied, said first reference potential being positive with respect to said second reference potential, a first source of a first clocking voltage having alternating periods of low level and high level, a second source of a second clocking voltage which is the inverse of said first clocking voltage, means for connecting said first source of clocking voltage to said first drain-adjacent gate and for connecting said second source of clocking voltage to said second drain-adjacent gate of each of the stages of one set of alternate stages of said shift register, means for connecting said first source of voltage to said second drain adjacent gate and for connecting said second source of clocking voltage to said first drain-adjacent gate of each of the stages of the other set of alternate stages of said shift register, said low level of said clocking voltages being sufficiently negative with respect to said first reference potential to render the portion of channel region underlying the first drain-adjacent gate of each of said stages conductive and the portion of the channel region underlying the second drain-adjacent gate of each of said stages nonconductive, said high level of said clocking voltages being sufficiently positive with respect to said second reference potential to render the portion of channel region underlying the first drain-adjacent gate of each of said stages nonconductive and the portion of the channel region underlying the second drain-adjacent gate of each of said stages conductive.

* * * * *